United States Patent
Person et al.

(10) Patent No.: US 8,254,442 B2
(45) Date of Patent: Aug. 28, 2012

(54) REAL TIME ENCODER WITH TIME AND BIT RATE CONSTRAINT, METHOD, COMPUTER PROGRAM PRODUCT AND CORRESPONDING STORAGE MEANS

(75) Inventors: Tanguy Person, Rennes (FR); Thomas Guionnet, Chantepie (FR); Michael Ropert, Miniac Morvan (FR)

(73) Assignee: Envivio France, Chantepie (FR)

( * ) Notice: Subject to any disclaimer, the term of this patent is extended or adjusted under 35 U.S.C. 154(b) by 1348 days.

(21) Appl. No.: 11/875,099

(22) Filed: Oct. 19, 2007

(65) Prior Publication Data

US 2008/0101461 A1 May 1, 2008

(30) Foreign Application Priority Data

Oct. 27, 2006 (FR) ..................... 06 09473

(51) Int. Cl.
- *H04N 7/12* (2006.01)
- *H04N 11/02* (2006.01)
- *H04N 11/04* (2006.01)
- *G01R 31/08* (2006.01)
- *G06F 11/00* (2006.01)
- *H04J 1/16* (2006.01)
- *H04J 3/14* (2006.01)
- *H04L 1/00* (2006.01)
- *H04L 12/26* (2006.01)
- *H04L 12/28* (2006.01)

(52) U.S. Cl. ................. 375/240.02; 370/230; 348/419.1

(58) Field of Classification Search .................. None
See application file for complete search history.

(56) References Cited

U.S. PATENT DOCUMENTS

| | | | |
|---|---|---|---|
| 2003/0123540 A1 | 7/2003 | Zhong et al. | 375/240.07 |
| 2003/0185222 A1 | 10/2003 | Goldstein | 370/401 |
| 2004/0047367 A1 | 3/2004 | Mammen | 370/422 |
| 2007/0271358 A1* | 11/2007 | Gaddy | 709/222 |

FOREIGN PATENT DOCUMENTS

| | | |
|---|---|---|
| EP | 0 562 221 A1 | 9/1993 |
| EP | 1 349 334 A1 | 10/2003 |

(Continued)

OTHER PUBLICATIONS

A. Isovic, G. Fowler, A. Prayati, C. Kolumas, G. Papadopolulpus, BETSY: Report on Temporal Impact of Identified Entities on End-to-End Timing, Feb. 6, 2005, pp. 1-49.*

(Continued)

*Primary Examiner* — John Blanton
*Assistant Examiner* — Christopher Crutchfield
(74) *Attorney, Agent, or Firm* — David D. Brush; Westman, Champlin & Kelly, P.A.

(57) ABSTRACT

A real time encoder with bit rate constraint, of the type including: a capture buffer memory storing frames waiting to be processed; an encoding module receiving frames issued from the capture buffer memory and delivering compressed frames; an intermediate buffer memory, storing the compressed frames issued from the encoding module; and an emission buffer memory, storing data packets, resulting from the division of the compressed frames issued from the intermediate buffer memory, and emitting, with a controlled bit rate, the data packets on a communication channel. The encoder includes a control module, which dynamically adjusts the maximum size of the capture buffer memory, permitting the maximum size of the capture buffer memory to be temporarily increased as long as the emission buffer memory is not empty.

15 Claims, 2 Drawing Sheets

FOREIGN PATENT DOCUMENTS

| | | |
|---|---|---|
| WO | WO 02/063461 A1 | 8/2002 |
| WO | WO 03/061298 A1 | 7/2003 |

OTHER PUBLICATIONS

C. Bormann, L. Cline, G. Deisher, T. Gardos, C. Maciocco, D. Newell, , J. Ott, G. Sullivan, S. Wenger and C. Zhu, RFC 2429: RTP Payload Format for the 1998 Version of ITU-T Rec. H.263 Video (H.263+), Oct. 1998, pp. 1-17.*

W. Bruin, H. Bos, Using Beltway Buffers for Efficient and Structured I/O, Sep. 2006, pp. 1-15.*

Tsang-Ling Sheu et al. "A buffer allocation mechanism for VBR video playback." Communication technology proceedings, 2000. WCC—ICCT 2000. International Conference on Beijing, China Aug. 21-25, 2000, Piscataway, NJ, USA, IEEE, US—vol. 2—Aug. 21, 2000, pp. 1641-1644.

"Efficient algorithms for MPEG video compression." Dzung Tien Hoang, Jeffrey Scott Vitter, Wiley, 2002.

French Search Report for corresponding foreign patent application No. FR 06/09473 filed Oct. 27, 2006.

"H.264 and MPEG-4 Video Compression." Iain E. G. Richardson, John Wiley & Sons. Sep. 2003,ISBN 0-470-84837-5.

* cited by examiner

REAL TIME ENCODER WITH TIME AND BIT RATE CONSTRAINT, METHOD, COMPUTER PROGRAM PRODUCT AND CORRESPONDING STORAGE MEANS

CROSS-REFERENCE TO RELATED APPLICATION

None.

FIELD OF THE DISCLOSURE

The field of the disclosure is that of data compression (audio and/or video).

More precisely, the disclosure relates to a real time encoding technique, with bit rate and time constraints. In one example of the disclosure, a real time encoder/decoder (codec) is proposed that has bit rate and time constraint.

BACKGROUND

In the present description, a frame is defined as set of successive items of data and a scene as a set of successive frames. In the specific case of video, a frame is an image.

The quantity of information (entropy) contained in a signal can vary hugely in time. For example, in the case of a video signal, it is possible to switch from a static scene containing smooth textures to a scene featuring many moving objects and complex textures. In this case, a significant increase of the complexity of the scene may be observed, and therefore of the quantity of information.

When compression techniques are used, this natural variability has two consequences:
 first of all, the bit rate of data generated by the encoder varies according to the scene;
 then, depending on the application strategy chosen, the time required for the encoding of each frame can vary.

Solutions have been developed to overcome these two problems.

Bit rate control techniques permit the output bit rate of the encoder to be regulated. It is possible to ensure either a constant bit rate or a variable bit rate. In both cases, an external constraint is respected, such as for example the physical capacity of a communication channel. If this external constraint varies in time, then this is the case of the variable bit rate (VBR). The control of the bit rate is based on the use of modelling of the emission buffer memory, which is also called "emission buffer" or even EBV (Emission Buffer Verifier). The emission buffer memory is also called VBV (for Video Buffer Verifier) in the case of the compression of a video signal or "reservoir-bit" in the case of the compression of an audio signal.

Further details on bit rate control may be found in: "Efficient algorithms for MPEG video compression", Dzung Tien Hoang, Jeffrey Scott Vitter, WILEY, 2002.

To ensure timely constant encoding per frame, the most simple solution consists of over sizing the equipment (processor, FPGA, etc.). However this solution is costly and not optimal, as the equipment is only rarely used to its full capacity. The opposite logic consists of limiting the complexity of the encoder.

In this case, the efficiency of the compression is limited and consequently the quality of the data compressed. Similarly, the equipment is only rarely used to its full capacity. Furthermore, the quality is not optimal in scenes of low complexity.

Ideally, it would be possible to limit the complexity of the encoder simply when the scene is too complex so that it could be processed in real time with the equipment available. Such a dynamic complexity control technique is presented in the patent document WO 03/061298 A1, dated 24 Jul. 2003.

Before resuming this dynamic complexity control technique, one example of a classic real time encoder will be described, based on the FIG. 1. The encoder is synchronised with a discreet clock. This clock is adjusted to the frequency of the frames. For example, at 25 frames per second, the clock will provide a "start" every 40 ms. These clock starts are indexed according to the variable t. The period of the starts, which is to say the duration between two successive starts, is noted P.

The example of the real time encoder of FIG. 1 comprises:
 a capture module 1 (for example in the form of a card or an appliance) which captures the input frames and converts them to a format that may be used by the encoding module. For example, a video input may be in the SDI format and the corresponding output in the raw YUV format;
 a capture buffer 2 where the frames waiting to be processed by the encoding module are stored. At the instant t, this capture buffer contains $N_c(t)$ frames;
 an encoding module 3 (for example in the form of an appliance) which makes the compression. At its input it takes a captured frame and sends to the output a compressed frame. It processes $V_e(t)$ frames per clock period at the instant t;
 an output buffer where the compressed frames issued from the encoding module are stored, waiting to be transferred to the emission buffer memory (EBV). At the instant t, this intermediate buffer memory contains $N_o(t)$ compressed frames;
 an emission buffer memory 5 (also called EBV for emission buffer verifier) which is an element that is essential to the correct operation of the bit rate regulation. The EBV, with its bit rate control logic, permits the variation of the size of the compressed frames to be partially compensated, whilst guaranteeing that the bit rate constraint is respected. The role of the bit rate control logic is to ensure that the EBV is never exceeded in capacity. The EBV models a buffer memory which stores the compressed frames until they are transmitted to the communication channel. Each frame that is compressed in the EBV is divided into data packets of a fixed size. At the instant t, the EBV contains $D_v(t)$ data packets.

The various elements 1 to 5 in the encoder are classically made using computer technology, with one or more elements of equipment (especially memory and processor components) and/or software (programs).

The data transfers, references A to E in FIG. 1, are described below. A data transfer is said to be synchronised if it is aligned with the clock, which is to say if occurs at each start. An unsynchronised data transfer is completely independent of the clock.

Transfer A (synchronised): at each start, a frame leaves the capture module 1 and is stored in the capture buffer memory 2.

Transfer B (unsynchronised): at the instant t, the encoding module 3 takes in input $V_e(t)$ frames per clock period.

Transfer C (non-synchronised): at the instant t, the encoding module 3 also sends to the output $V_e(t)$ compressed frames per clock period.

Transfer D (synchronised): at each start, the EBV 5 takes in input $V_o(t)$ data packets (which generally correspond to one compressed frame).

Transfer E (synchronised): the VBV sends to the output a data packet at each start. It thus guarantees a controlled bit rate on the communication channel. In the case of a constant bit rate (CBR), the size of the data packets is constant and thus the output bit rate is constant.

Classically, the process formed by the set of transfers A to E is controlled by a program run by one or several processors in the encoder.

The function of the two capture buffer 2 and intermediate 4 memories is to compensate the variation in processing time per frame of the encoder ($V_e(t)$). These two buffer memories are synchronised. When one is emptied, the other is filled. Wherein $M_c$ is the maximum size of each of these two buffer memories. Where: $N_o(t)=M_c-N_c(t)$.

If the processing time by the encoding module remains greater than P (which is to say if $V_e(t)<1$) for too long a period, the capture buffer memory is filled. The only way to respect the real time constraint is then to eliminate frames. In the case of video decoding, when the compressed video is decoded and displayed, this is translated by visually unacceptable jerky images.

In order to avoid the suppression of frames, the technique presented in the patent document WO 03/061298 A1 consists of using a complexity control mechanism. This mechanism will now be described in relation to FIG. 2. The encoder comprises the additional following element: a control module 6 (also called RTC, Real-Time Controller) which monitors the filling level $N_c(t)$ of the capture buffer memory 2 (this monitoring is shown by the arrow reference 7). This filling level $N_c(t)$ is the number of frames contained in the capture buffer memory. According to this filling level, it controls the complexity of the encoding module (this control is shown by the arrow reference 8). A series of thresholds with hysteresis are pre-defined. At each filling level of the capture buffer memory 2 corresponds a set of parameters for the encoding module 3. Due to the synchronisation property mentioned above (between the capture buffer memory 2 and the intermediate buffer memory 4), it is not necessary to monitor the filling of the intermediate buffer memory 4.

Unfortunately, the solution presented above is efficient but not optimal for two reasons:
- firstly, reducing the complexity of the encoding module 3 implies lowering the quality of the compressed frames;
- then, if in spite of the adjustment of the complexity of the encoding module 3, the encoding time is still too long, it may still be necessary to eliminate frames. This problem is that of a complexity peak that is too long.

By increasing the size of the capture buffer memory 2, it is possible to process longer complexity peaks, or to maintain the quality of the compressed data (for example video) until the complexity peak has passed. However this introduces an extra time to the overall output of the encoder. In fact, the encoder as it is presented introduces a time whose size is at least $M_c$. Which is to say that if a frame enters the encoder at the instant t, it will leave at the earliest at the instant $t+P \cdot M_c$. Similarly, each element of the encoder may introduce a time. If $D_e$ is the time introduced by the encoding module 3 of the encoder and $D_{EBV}$ is the time introduced by the emission buffer memory 5 (EBV), then the time total of the encoder is: $D=M_c+D_e+D_{ebv}$.

SUMMARY

In one specific example, a real time encoder with bit rate constraint and time constraint is proposed, of the type comprising:
- a capture buffer memory, with a maximum initial size and storing frames waiting to be processed;
- an encoding module, receiving frames issued from the capture buffer memory and delivering compressed frames;
- an intermediate buffer memory, storing the compressed frames issued from the encoding module; and
- an emission buffer memory, storing the data packets, resulting from the division of the compressed frames issued from the intermediate buffer memory, and emitting, with a controlled bit rate, said data packets on a communication channel;

said encoder comprising a control module comprising dynamic adjustment means for the maximum size of the capture buffer memory, permitting the following rules to be applied:
- if the emission buffer memory is empty, the maximum size of the capture buffer memory is equal to said maximum initial size; and
- if the emission buffer memory is not empty, the maximum size of the capture buffer memory is temporarily increased and is equal to a maximum temporary size.

The general principle of the disclosure includes therefore of temporarily increasing the size of the capture buffer memory without increasing the overall time of the encoder. The idea consists of using the filling level of the emission buffer memory (EBV), which is to say the number of packets contained in the emission buffer memory. In fact, for a given filling level, the emptying time of the EBV is a priori known, thanks to the bit rate constraint. The capacity of the capture buffer memory may temporarily be increased, as long as the EBV is not empty. The delay thus incurred must be compensated before the EBV is emptied. Consequently, it is possible to support longer complexity peaks without reducing the quality of the compressed frames, or increasing the overall time of the encoder.

Advantageously, the maximum temporary size $M_c'$ of the capture buffer memory is defined by the following equation: $M_c \leq M_c' \leq M_c + D_v(t)$, where $M_c$ is the maximum initial size of the capture buffer memory, and $D_v(t)$ is the filling level of the emission buffer memory expressed in number of packets contained in the emission buffer memory.

Advantageously, the control module comprises means of managing the speed of emptying the intermediate buffer memory to suit the filling level of the capture buffer memory expressed in number of frames contained in the capture buffer memory.

In one advantageous characteristic, said means de managing the speed of emptying the intermediate buffer memory apply the following rules:
- if $N_c(t)=M_c$, then the emptying of the intermediate buffer memory is carried out synchronised with the filling of the capture buffer memory, and
- if $N_c(t)>M_c$, then the emptying of the intermediate buffer memory is carried out instantaneously and without synchronisation with the filling of the capture buffer memory, where $M_c$ is the maximum initial size of the intermediate buffer memory, and $N_c(t)$ is the filling level of the capture buffer memory expressed in number of frames contained in the capture buffer memory.

In one advantageous example, the control module comprises means of dynamically adjusting the complexity of the encoding module by dynamic selection of a level of complexity from at least two distinct levels of complexity, according to the filling level $N_c(t)$ of the capture buffer memory expressed in number of frames contained in the capture buffer memory and the filling level $D_v(t)$ of the emission buffer memory expressed in number of packets contained in the emission buffer memory.

Advantageously, said means of dynamically adjusting the complexity of the encoding module apply the following rules:
if $N_c(t) \geq k*M_c"$, where $M_c"=M_c+D_v(t)$, then reduction of the complexity of the encoding module,
otherwise, no reduction of the complexity of the encoding module, where k<1 and $M_c$ is the maximum initial size of the capture buffer memory.

In one advantageous variant, said means of dynamically adjusting the complexity of the encoding module apply the following rules:
if $N_c(t) \geq k*M_c"$, where $M_c"=MIN(M_c+D_v(t), M_c+K)$, and if $D_v(t)<r*M_v$, then reduction of the complexity of the encoding module,
otherwise, no reduction of the complexity of the encoding module, where K is a positive constant, k<1, r<1 and $M_c$ is the maximum initial size of 1a capture buffer memory.

Advantageously, k is between 0.7 and 0.9, r is between 0.2 and 0.4, and $K=M_c/2$.

In another example, the disclosure relates to a method for a real time encoder with bit rate constraint and time constraint, of the type comprising:
  a capture buffer memory, with a maximum initial size and storing frames waiting to be processed;
  an encoding module, receiving frames issued from the capture buffer memory and delivering compressed frames;
  an intermediate buffer memory, storing compressed frames issued from the encoding module; and
  an emission buffer memory, storing data packets, resulting from the division of the compressed frames issued from the intermediate buffer memory, and emitting, with a controlled bit rate, said data packets onto a communication channel;
said method comprising a dynamic adjustment step of the maximum size of the capture buffer memory, permitting the following rules to be applied:
  if the emission buffer memory is empty, the maximum size of the capture buffer memory is equal to said maximum initial size; and
  if the emission buffer memory is not empty, the maximum size of the capture buffer memory is temporarily increased and is equal to a maximum temporary size.

More generally, different examples of this control method may be envisaged, of which the characteristics result from the transposition in the form of steps of the means included in the control module mentioned above.

In another example, the disclosure relates to a computer program product that may be downloaded from a communication network and/or saved to a support that may be read by a computer and/or run by a processor, wherein said computer program product comprises program code instructions to run the steps of the control process mentioned above, when said program is run on a computer.

In another example, the disclosure relates to storage means, that may be totally or partially removable, that may be read by a computer, storing a set of instructions that may be run by said computer to use the control process mentioned above.

Other characteristics and advantages of will become clearer after reading the following description, provided purely by way of example and in no way restrictively (none of the embodiments of the disclosure are limited to the characteristics and advantages of the embodiments described hereunder), and appended drawings.

DETAILED DESCRIPTION OF ILLUSTRATIVE EMBODIMENTS

In all of the figures of the present document, the identical elements and steps are designated with a same numerical reference.

In the following description, the specific case of the compression of a video signal will be considered, wherein a frame is an image.

Figure 3:
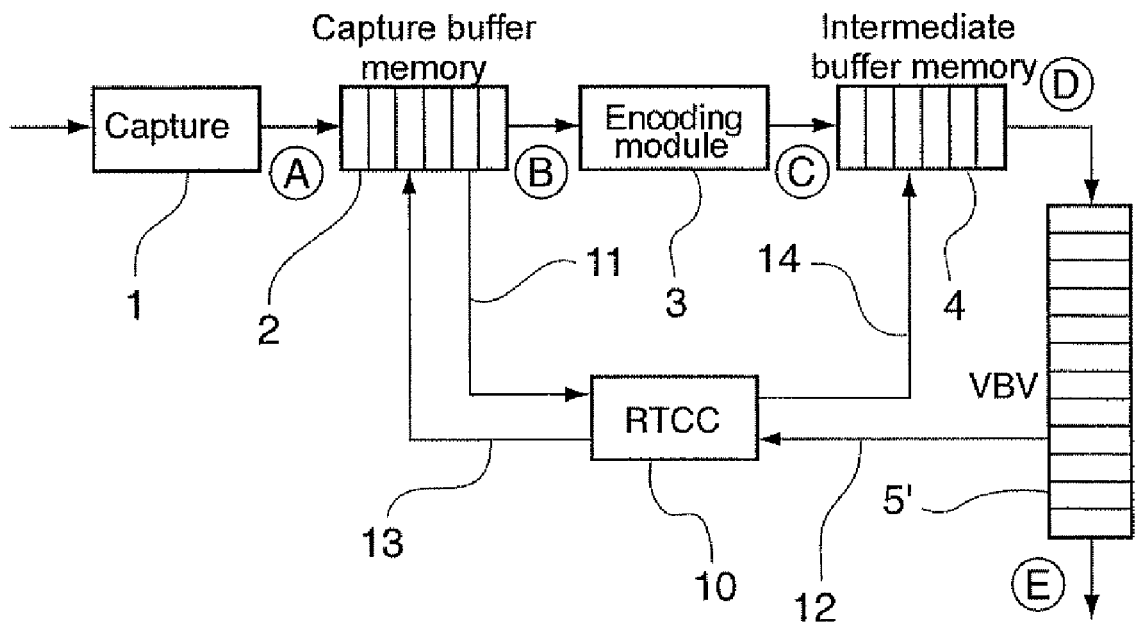
FIG. 3 shows a block diagram of a real time video encoder with bit rate and time constraint, with dynamic control of the size of the capture buffer memory, in a first example of the present disclosure.

Now will be presented, in relation to FIG. 3, a real time video encoder with bit rate and time constraint, with dynamic control of the size of the capture buffer memory, in a first example of the disclosure.

Figure 1:
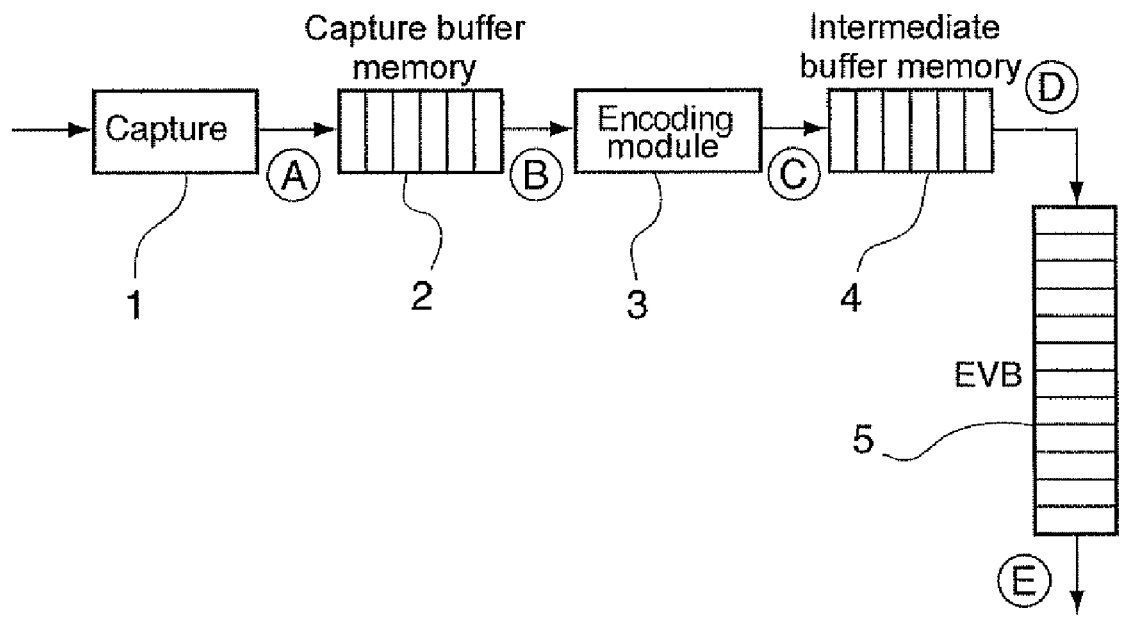
FIG. 1 shows a block diagram of a real time encoder with bit rate constraint, of the prior art.
Figure 2:
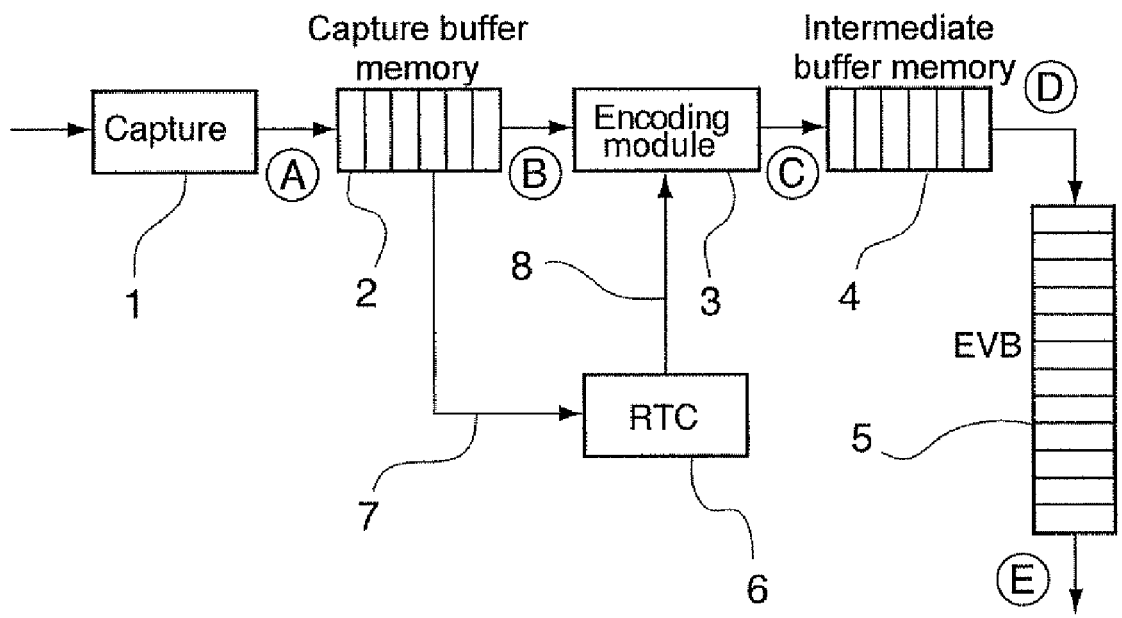
FIG. 2 shows a block diagram of a real time encoder with bit rate constraint, with dynamic complexity control, of the prior art.

As the classic real time encoder of FIG. 1 (the only difference is that the EBV is called VBV), it comprises:
  a capture module 1 which captures the images at the input and converts them to a format that may be used by the encoding module 3;
  a capture buffer memory 2 where the images waiting to be processed by the encoding module 3 are stored. At the instant t, this capture buffer memory contains $N_c(t)$ images;
  an encoding module 3 which carries out the compression. It takes an image captured at the input and sends to the output a compressed image. It processes $V_e(t)$ images per clock period at the instant t;
  an intermediate buffer memory 4 where the compressed images issued from the encoding module are stored, waiting to be transferred to the emission buffer memory. At the instant t, this intermediate buffer memory contains $N_o(t)$ compressed images;
  an emission buffer memory 5' (also called VBV) which, with its bit rate control logic, permits the variation in the size of the compressed images to be partially compensated whilst guaranteeing the respect of the bit rate constraint. The emission buffer memory 5' stores the compressed images until they are transmitted to the communication channel. More precisely, it stores fixed size data packets, resulting from the division of the compressed images. At the instant t, it contains $D_v(t)$ data packets.

It further comprises a control module 10 (also called RTCC, Real-Time Capture Controller) which, in one specific example, carries out the following actions:
  it monitors the filling level $N_c(t)$ of the capture buffer memory 2.
  This monitoring is shown by the arrow reference 11;
  it monitors the filling level $D_v(t)$ of the emission buffer memory 5' (VBV). This monitoring is shown by the arrow reference 12;
  it dynamically controls the maximum size of the capture buffer memory 2 according to $N_c(t)$ and $D_v(t)$. This control is shown by the arrow reference 13. The capture buffer 2 and intermediate 4 memories each have an initial size fixed at $M_c$. If the capture buffer memory 2 is filled, it may be authorised to contain $M_c'$ images where $M_c \geq M_c' = M_c + D_v(t)$. As long as this constraint is respected, the time introduced by the encoder (which is to say the entire system) remains $D = M_c + D_e + Dvbv$ as previously;

it controls the emptying speed of the intermediate buffer memory 4 according to $N_c(t)$. This control is shown by the arrow reference 14. When $N_c(t) \leq M_c$, the emptying is carried out in synchronisation, as previously described. When $N_c(t) > M_c$, the buffer memory intermediate 4 is empty. It then operates in "instantaneous" mode. Which is to say that as soon as the encoding module 3 emits a compressed image, it is directly transferred to the emission buffer memory 5' (VBV), without waiting for the synchronisation. This means accelerating the emptying of the emission buffer memory 5' (VBV), in order to compensate the delay introduced by the increase in the size of the capture buffer memory 2.

The control module 10 (RTCC) is for example made by a program run by a processor.

Figure 4:
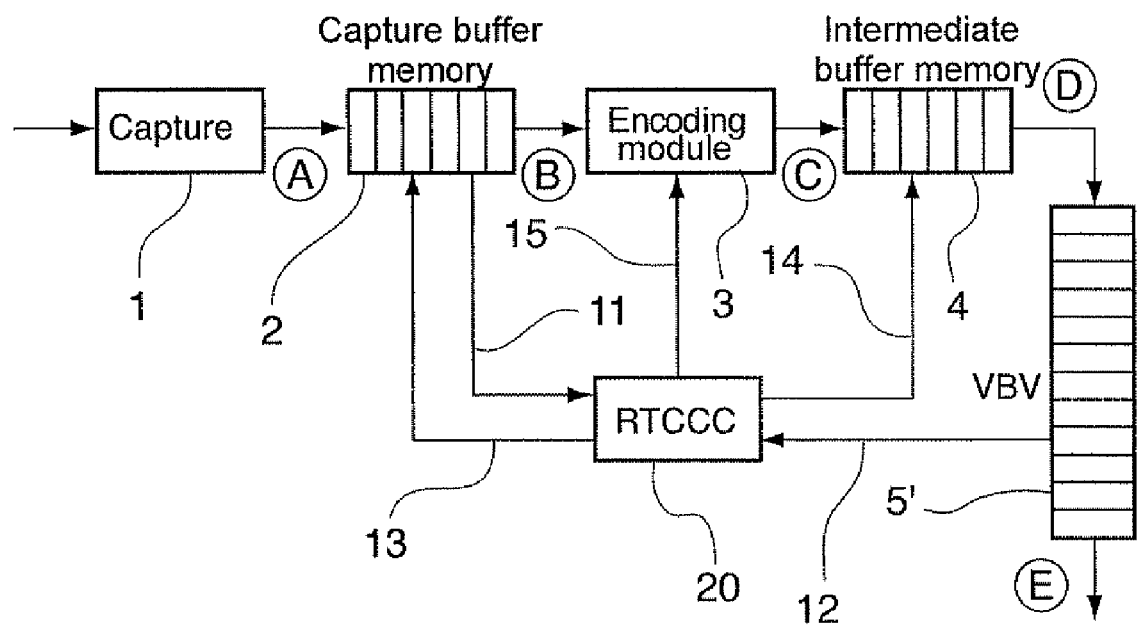
FIG. 4 shows a block diagram of a real time video encoder with bit rate and time constraint, with dynamic control of the size of the capture buffer memory and the complexity, in a second example of the disclosure.

Now will be presented, in relation to FIG. 4, a real time video encoder with bit rate and time constraint, with dynamic control of the size of the capture buffer memory and the complexity, in a second example of the disclosure.

This second example is different from the first (described above in relation to FIG. 3) in that the control module 20 (also called RTCCC, Real-Time Capture and Complexity Controller) carries out the same actions as the control module 10 of FIG. 3, and the following additional action:

it dynamically adjusts the complexity of the encoding module 3 according to $N_c(t)$ and $D_v(t)$. This control is shown by the arrow reference 15.

This second example is used with an encoder H.264/MPEG4-10 AVC, for example. Such an encoder divides the images into macro-blocks. Each macro-block is encoded according to a mode selected in a predefined list. In particular, the 16×16, 16×8, 8×16 and 8×8 modes are defined for the "P" macro-blocks. The selection of the best encoding mode for a macro-block is a costly process. In order to reduce the complexity of the encoder, the list of modes tested for each macro-block is reduced. In this way, two levels of complexity are defined for the encoder (obviously however in other examples, more than two levels of complexity may be used). A standard level where all modes are authorised for the P blocks, and a reduced level of complexity where only the 16×16 mode is authorised. For more information on the operation of the H.264/MPEG4-10 AVC standard, refer to "H.264 and MPEG-4 Video Compression", Iain E G Richardson, John Wiley & Sons, September 2003, ISBN 0-470-84837-5.

Different configurations are possible. For example, the thresholds may be adjusted either according to $M_c$, or according to $M_c'$.

In a first configuration, the reduced level of complexity is chosen when the filling level $N_c(t)$ of the capture buffer memory 2 is greater than $0.8*M_c''$, where $M_c'' = \mathrm{MAX}(M_c') = M_c + D_v(t)$.

In a second, more interesting configuration, there is:
$M_c'' = \mathrm{MIN}(\mathrm{MAX}(M_c'), M_c + K)$, where K is a positive constant, for example $M_c/2$ and $\mathrm{MAX}(M_c') = M_c + D_v(t)$;
passing to the reduced level of complexity takes place when $N_c(t) > 0.8*M_c''$
AND $D_v(t) < 0.3*M_v$, where $M_v$ is the maximum size of the emission buffer memory 5' (VBV), which is to say the maximum number of packets that the VBV can contain.

This second configuration permits better use of the knowledge of the filling level of the emission buffer memory (VBV). The value of $M_c'$ is limited in order to avoid reaching excessive filling levels of the capture buffer memory 2. The purpose is to ensure the success of passing $N_c(t)$ below $M_c$.

The control module 20 (RTCCC) is for example made by a program run by a processor.

It may be noted that the disclosure is not limited to a purely software installation (sequence of instructions for a computer program), but that it may also be used in the form of equipment or any mixed form using one part of equipment and one part software. In the case of the disclosure being partially or totally installed in software form, the corresponding sequence of instructions may be stored on removable storage means (such as for example a floppy disk, a CD-ROM or a DVD-ROM) or non removable storage means, wherein this storage means may be read partially or totally by a computer or a microprocessor.

The present disclosure provides a real time encoding technique with bit rate constraints, that also has a time constraint.

The disclosure provides such a technique permitting the tolerance of an encoder to the variation in complexity of a scene to be increased without necessarily requiring dynamic control of the complexity of said encoder.

The disclosure provides such a technique permitting, with respect to the prior art, to reduce the number of frames eliminated due to the capture buffer memory being exceeded without increasing the overall time induced by the encoder, nor reducing the quality of the compressed frames.

The disclosure provides such a technique that may be combined with the known principle of dynamic control of the complexity of the encoding module 3.

The disclosure provides such a technique that is simple and cheap to use.

Although the present disclosure has been described with reference to one or more illustrative examples, workers skilled in the art will recognize that changes may be made in form and detail without departing from the spirit and scope of the disclosure and/or the appended claims.

What is claimed is:

1. Real time encoder, with a bit rate constraint and a time constraint, comprising:
    a capture buffer memory, with a maximum initial size $M_c$ and for storing frames waiting to be processed;
    an encoding module, receiving frames issued from the capture buffer memory and delivering compressed frames;
    an intermediate buffer memory, storing the compressed frames issued from the encoding module;
    an emission buffer memory, storing data packets, resulting from division of the compressed frames issued from the intermediate buffer memory, and emitting, with a controlled bit rate, said data packets on a communication channel, wherein the emission buffer memory has a filling level $D_v(t)$ expressed in number of packets contained in the emission buffer memory; and
    a control module, which dynamically adjusts the maximum size of the capture buffer memory according to the following rules:
    if the emission buffer memory is empty, the maximum size of the capture buffer memory is equal to said maximum initial size; and
    if the emission buffer memory is not empty, the maximum size of the capture buffer memory is temporarily increased and is equal to a maximum temporary size $M_c'$, wherein:

$$M_c < M_c' \leq M_c + D_v(t).$$

2. Encoder of claim 1, wherein the control module manages the speed of the emptying of the intermediate buffer memory according to a filling level of the capture buffer memory expressed in number of frames contained in the capture buffer memory.

3. Encoder of claim 2, wherein said control module manages the speed of the emptying of the intermediate buffer memory according to the following rules:
 if $N_c(t) \leq M_c$, then the emptying of the intermediate buffer memory is carried out in synchronisation with the filling of the capture buffer memory, and
 if $N_c(t) > M_c$, then the emptying of the intermediate buffer memory is carried out instantaneously and without synchronisation with the filling of the capture buffer memory,
 where $M_c$ also corresponds to a maximum initial size of the intermediate buffer memory, and $N_c(t)$ is the filling level of the capture buffer memory expressed in number of frames contained in the capture buffer memory.

4. Encoder of claim 1, wherein the control module dynamically adjusts the complexity of the encoding module by dynamic selection of a level of complexity from at least two distinct levels of complexity, according to a filling level $N_c(t)$ of the capture buffer memory expressed in number of frames contained in the capture buffer memory and the filling level $D_v(t)$ of the emission buffer memory expressed in number of packets contained in the emission buffer memory.

5. Encoder of claim 4, wherein said control module adjusts the complexity of the encoding module according to the following rules:
 if $N_c(t) \geq k*M_c''$, where $M_c''=M_c+D_v(t)$, then said control module reduces the complexity of the encoding module,
 otherwise, no reduction of the complexity of the encoding module,
 where $k<1$ and $M_c$ is the maximum initial size of the capture buffer memory.

6. Encoder of claim 4, wherein said control module adjusts the complexity of the encoding module according to the following rules:
 if $N_c(t) > k*M_c''$, where $M_c''=\mathrm{MIN}(M_c+D_v(t), M_c+K)$, and if $D_v(t) < r*M_v$, then said control module reduces the complexity of the encoding module,
 otherwise, no reduction of the complexity of the encoding module,
 where K is a positive constant, $k<1$, $r<1$, $M_c$ is the maximum initial size of the capture buffer memory and $M_v$ is the maximum size of the emission buffer memory.

7. Encoder of claim 5, wherein k is between 0.7 and 0.9, and in that r is between 0.2 and 0.4, and in that $K=M_c/2$.

8. Control method of a real time encoder, with a bit rate constraint and a time constraint, the method comprising:
 storing frames waiting to be processed in a capture buffer memory, which has a maximum initial size $M_c$;
 receiving frames issued from the capture buffer memory in an encoding module and delivering compressed frames from the encoding module;
 storing the compressed frames issued from the encoding module in an intermediate buffer memory;
 storing data packets, resulting from division of the compressed frames issued from the intermediate buffer memory, in an emission buffer memory and emitting, with a controlled bit rate, said data packets on a communication channel, wherein the emission buffer memory has a filling level $D_v(t)$ expressed in number of packets contained in the emission buffer memory; and
 dynamically adjusting the maximum size of the capture buffer memory according to the following rules:
  if the emission buffer memory is empty, the maximum size of the capture buffer memory is equal to said maximum initial size; and
  if the emission buffer memory is not empty, the maximum size of the capture buffer memory is temporarily increased and is equal to a maximum temporary size $M_c'$, wherein:

$$M_c < M_c' \leq M_c + D_v(t).$$

9. Method of claim 8, wherein the method comprises managing the speed of the emptying of the intermediate buffer memory according to a filling level of the capture buffer memory expressed in number of frames contained in the capture buffer memory.

10. Method of claim 9, wherein in said step of managing the speed of the emptying of the intermediate buffer memory, the following rules are applied:
 if $N_c(t) \leq M_c$, then the emptying of the intermediate buffer memory is carried out in synchronisation with the filling of the capture buffer memory, and
 if $N_c(t) > M_c$, then the emptying of the intermediate buffer memory is carried out instantaneously and without synchronisation with the filling of the capture buffer memory,
 where $M_c$ is also corresponds to a maximum initial size of the intermediate buffer memory, and $N_c(t)$ is the filling level of the capture buffer memory expressed in number of frames contained in the capture buffer memory.

11. Method of claim 8, wherein the method comprises dynamically adjusting the complexity of the encoding module by dynamic selection of a level of complexity from at least two distinct levels of complexity, according to a filling level $N_c(t)$ of the capture buffer memory expressed in number of frames contained in the capture buffer memory and of the filling level $D_v(t)$ of the emission buffer memory expressed in number of packets contained in the emission buffer memory.

12. Method of claim 11, wherein in said step of dynamic adjustment of the complexity of the encoding module, the following rules are applied:
 if $N_c(t) \geq k*M_c''$, where $M_c''=M_c+D_v(t)$, then the complexity of the encoding module is reduced,
 otherwise, the complexity of the encoding module is not reduced,
 where $k<1$ and $M_c$ is the maximum initial size of the capture buffer memory.

13. Method of claim 11, wherein in said step of dynamic adjustment of the complexity of the encoding module, the following rules are applied:
 if $N_c(t) > k*M_c''$, where $M_c''=\mathrm{MIN}(M_c+D_v(t), M_c+K)$, and if $D_v(t) < r*M_v$, then the complexity of the encoding module is reduced,
 otherwise, the complexity of the encoding module is not reduced,
 where K is a positive constant, $k<1$, $r<1$, $M_c$ is the maximum initial size of the capture buffer memory and $M_v$ is the maximum size of the emission buffer memory.

14. Method of claim 12, wherein k is between 0.7 and 0.9, in that r is between 0.2 and 0.4, and in that $K=M_c/2$.

15. A non-transitory computer readable medium that may be read by a computer, storing a set of instructions that may be run by said computer in order to implement a control process of a real time encoder, with a bit rate constraint and a time constraint, the control process comprising:
 storing frames waiting to be processed in a capture buffer memory, which has a maximum initial size;

receiving frames issued from the capture buffer memory in an encoding module and delivering compressed frames from the encoding module;

storing the compressed frames issued from the encoding module in an intermediate buffer memory; and storing data packets, resulting from division of the compressed frames issued from the intermediate buffer memory, in an emission buffer memory and emitting from the emission buffer memory, with a controlled bit rate, said data packets on a communication channel, wherein the emission buffer memory has a filling level $D_v(t)$ expressed in number of packets contained in the emission buffer memory; and dynamically adjusting the maximum size of the capture buffer memory according to the following rules:

if the emission buffer memory is empty, the maximum size of the capture buffer memory is equal to said maximum initial size; and if the emission buffer memory is not empty, the maximum size of the capture buffer memory is temporarily increased and is equal to a maximum temporary size $M_c'$, wherein:

$$M_c < M_c' \leq M_c + D_v(t).$$

* * * * *